United States Patent
Tanaka (10) Patent No.: US 10,386,587 B2
(45) Date of Patent: Aug. 20, 2019

(54) OPTICAL FIBER FIXATION STRUCTURE, SEMICONDUCTOR LASER MODULE, AND METHOD OF MANUFACTURING SEMICONDUCTOR LASER MODULE

(71) Applicant: FUJIKURA LTD., Tokyo (JP)

(72) Inventor: Hironori Tanaka, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 15/608,004

(22) Filed: May 30, 2017

(65) Prior Publication Data

US 2017/0261702 A1 Sep. 14, 2017

Related U.S. Application Data

(63) Continuation of application No. PCT/JP2015/083136, filed on Nov. 25, 2015.

(30) Foreign Application Priority Data

Dec. 1, 2014 (JP) .................................. 2014-243134

(51) Int. Cl.
*G02B 6/42* (2006.01)
*H01S 5/022* (2006.01)

(52) U.S. Cl.
CPC .......... *G02B 6/424* (2013.01); *G02B 6/4239* (2013.01); *H01S 5/022* (2013.01)

(58) Field of Classification Search
None
See application file for complete search history.

(56) References Cited

U.S. PATENT DOCUMENTS

| | | | |
|---|---|---|---|
| 4,523,802 A | 6/1985 | Sakaguchi et al. | |
| 5,185,835 A * | 2/1993 | Vial | G02B 6/30 385/14 |
| 5,568,892 A * | 10/1996 | Basavanhally | G02B 6/4225 228/105 |

(Continued)

FOREIGN PATENT DOCUMENTS

| | | | |
|---|---|---|---|
| CA | 2062571 C | | 9/1992 |
| CA | 2062571 C | * | 4/2003 |

(Continued)

OTHER PUBLICATIONS

Saito et al. (Machine Translation of JP08054537A, Feb. 1996).*

(Continued)

*Primary Examiner* — Michelle R Connelly
(74) *Attorney, Agent, or Firm* — Westerman, Hattori, Daniels & Adrian, LLP (57) ABSTRACT

The present invention provides a semiconductor laser module with high reliability that has a simple structure that can prevent a resin for fixing an optical fiber from coming off. The semiconductor laser module 1 has a base plate 11, a semiconductor laser device 22 disposed on the base plate 11, an optical fiber 30 operable to transmit a laser beam emitted from the semiconductor laser device 22, a fiber mount 40 that projects from an upper surface 11A of the base plate 11, and a resin 50 for fixing the optical fiber 30 on the fiber mount 40. The resin 50 is formed so as to cover side surfaces 42A, 42B, 43A, and 43B of the fiber mount 40.

14 Claims, 6 Drawing Sheets

(56) References Cited

U.S. PATENT DOCUMENTS

| | | | | | |
|---|---|---|---|---|---|
| 5,727,105 | A | * | 3/1998 | Nagata | G02B 6/30 385/88 |
| 6,027,255 | A | * | 2/2000 | Joo | G02B 6/4212 385/88 |
| 6,371,664 | B2 | * | 4/2002 | Takahashi | G02B 6/4239 385/33 |
| 6,435,734 | B2 | * | 8/2002 | Okada | G02B 6/4212 385/88 |
| 6,524,017 | B2 | * | 2/2003 | Lecocq | G02B 6/4212 257/431 |
| 7,031,572 | B2 | * | 4/2006 | Gruhlke | G02B 6/4206 385/27 |
| 7,050,678 | B1 | * | 5/2006 | Isono | G02B 6/423 385/15 |
| 8,000,567 | B2 | * | 8/2011 | Miyokawa | G02B 6/4201 385/14 |
| 8,909,010 | B2 | * | 12/2014 | Kimura | G02B 6/4214 385/49 |
| 2001/0024549 | A1 | * | 9/2001 | Takahashi | G02B 6/4239 385/49 |
| 2001/0026665 | A1 | * | 10/2001 | Ando | G02B 6/4201 385/94 |
| 2002/0037143 | A1 | * | 3/2002 | Kuhara | G02B 6/29361 385/94 |
| 2002/0094146 | A1 | * | 7/2002 | Yamaguchi | G02B 6/421 385/2 |
| 2003/0053757 | A1 | * | 3/2003 | Gao | G02B 6/2551 385/49 |
| 2003/0142921 | A1 | * | 7/2003 | Dallas | G02B 6/3644 385/80 |
| 2003/0152343 | A1 | * | 8/2003 | Yamada | G02B 6/3636 385/99 |
| 2003/0165305 | A1 | * | 9/2003 | Dallas | G02B 6/4201 385/92 |
| 2004/0228601 | A1 | * | 11/2004 | Porter | G02B 6/3803 385/139 |
| 2007/0206902 | A1 | * | 9/2007 | Blauvelt | G02B 6/4201 385/49 |
| 2011/0317735 | A1 | * | 12/2011 | Miyokawa | G02B 6/4238 372/50.1 |
| 2013/0022066 | A1 | | 1/2013 | Toyohara et al. | |
| 2013/0022067 | A1 | | 1/2013 | Sakamoto et al. | |
| 2013/0215924 | A1 | * | 8/2013 | Brennan | H01S 3/091 372/70 |
| 2014/0059831 | A1 | * | 3/2014 | Sakamoto | G02B 6/4201 29/428 |
| 2015/0286015 | A1 | * | 10/2015 | Miyokawa | G02B 6/4206 385/33 |

FOREIGN PATENT DOCUMENTS

| | | | |
|---|---|---|---|
| CN | 102822710 | A | 12/2012 |
| CN | 102844943 | A | 12/2012 |
| CN | 103443681 | A | 12/2013 |
| JP | 57-138191 | A | 8/1982 |
| JP | 08054537 | A * | 2/1996 |
| JP | 2787122 | B2 * | 8/1998 |
| JP | 11068254 | A * | 3/1999 |
| JP | 11-154772 | A | 6/1999 |
| JP | 2002-48951 | A | 2/2002 |
| JP | 2004-264543 | A | 9/2004 |
| JP | 2007-234963 | A | 9/2007 |
| JP | 2013-57721 | A | 3/2013 |
| JP | 2014-139648 | A | 7/2014 |
| TW | 232056 | B | 10/1994 |
| WO | 2014/097710 | A1 | 6/2014 |

OTHER PUBLICATIONS

International Search Report dated Feb. 16, 2016, issued in counterpart application No. PCT/JP2015/083136. (2 pages).

Extended (supplementary) European Search Report dated Jul. 4, 2018, issued in counterpart European Application No. 158650572. (10 pages).

Office Action dated Apr. 24, 2018, issued in counterpart Chinese Application No. 201580065044.5. (6 pages).

* cited by examiner

OPTICAL FIBER FIXATION STRUCTURE, SEMICONDUCTOR LASER MODULE, AND METHOD OF MANUFACTURING SEMICONDUCTOR LASER MODULE

TECHNICAL FIELD

The present invention relates to an optical fiber fixation structure, and more particularly to a structure used to fix an optical fiber in a semiconductor laser module.

BACKGROUND ART

In an optical device such as a semiconductor laser module, in order to enhance an optical coupling rate between a functional part (such as an LD chip) of the optical device and a core of an optical fiber, it is necessary to highly precisely align the functional part and the core of the optical fiber with each other and maintain the positional relationship between the functional element and the core of the optical fiber. If such a positional relationship is destroyed (misalignment is caused), the optical device cannot demonstrate desired characteristics, resulting in a defective product.

Figure 1:
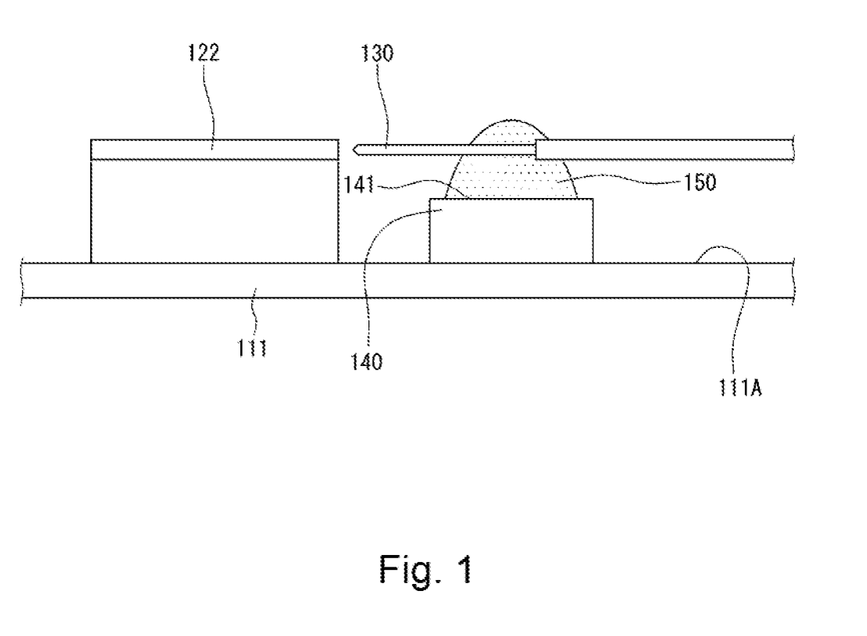
FIG. 1 is a front view schematically showing a conventional optical fiber fixation structure.

FIG. 1 is a front view schematically showing a conventional optical fiber fixation structure. As shown in FIG. 1, in the conventional optical fiber fixation structure, a fiber mount 140 is fixed to an upper surface 111A of a base plate 111, and a resin 150 is applied as an adhesive agent to an upper surface 141 of the fiber mount 140. Thus, the optical fiber 130 is fixed to the fiber mount 140 by the resin 150.

However, in the conventional optical fiber fixation structure, the resin 150 may come off the fiber mount 140, for example, when a strong tensile stress is applied to the optical fiber 130. If the resin 150 comes off the fiber mount 140, the optical fiber 130 moves freely on the fiber mount 140 so that the optical fiber 130 is deviated from the semiconductor laser device 122 (positional misalignment is caused). Thus, in the conventional optical fiber fixation structure, the resin 150 that comes off directly causes positional misalignment of the optical fiber 130. Therefore, the conventional optical fiber fixation structure problematically has low reliability.

In order to prevent such positional misalignment of an optical fiber, there has been proposed a method of using a fiber fixing pedestal in which a groove is formed along an optical axis of an optical fiber and fixing the optical fiber to the fiber fixing pedestal by an adhesive agent (see, e.g., Patent Literature 1). With this method, the adhesive agent is disposed within the groove formed in the fiber fixing pedestal so as to form spaces above and below the optical fiber. Those spaces provide relief for the shape change of the adhesive agent upon expansion or shrinkage of the adhesive agent. Therefore, an excessive force is prevented from being applied to an outer circumference of the optical fiber.

In such a method, however, a groove needs to be formed along an optical axis of an optical fiber in the fiber fixing pedestal. Therefore, a structure for fixing the optical fiber becomes complicated, and the cost for manufacturing such a structure also increases. Furthermore, in order to reduce the positional misalignment of the optical fiber due to thermal shrinkage or expansion of the adhesive agent, which is caused by various factors including shrinkage of the adhesive agent upon curing for fixing the optical fiber, the location and angle of the groove of the fiber fixing pedestal needs to match accurately with the optical axis of a laser beam emitted from the semiconductor laser device. Therefore, it is feared that the manufacturing process of the semiconductor laser module becomes cumbersome.

Moreover, since the groove of the fiber fixing pedestal extends along the optical axis of the optical fiber, the adhesive agent may come off the fiber fixing pedestal if a tensile stress is applied along the optical axis of the optical fiber. Accordingly, the positional misalignment of the optical fiber is likely to occur as with the structure shown in FIG. 1.

PRIOR ART LITERATURE

Patent Literature

[Patent Literature 1] JP 2014-139648 A

SUMMARY OF THE INVENTION

Problem(s) to be Solved by the Invention

The present invention has been made in view of the above drawbacks in the prior art. It is, therefore, a first object of the present invention to provide an optical fiber fixation structure with high reliability that has a simple structure that can prevent a resin for fixing an optical fiber from coming off.

Furthermore, a second object of the present invention is to provide a semiconductor laser module with high reliability that has a simple structure that can prevent a resin for fixing an optical fiber from coming off.

Moreover, a third object of the present invention is to provide a method of manufacturing a semiconductor laser module that can firmly fix an optical fiber by a resin and can prevent the resin from coming off.

Means for Solving Problem(s)

According to a first aspect of the present invention, there is provided an optical fiber fixation structure with high reliability that has a simple structure that can prevent a resin for fixing an optical fiber from coming off. The optical fiber fixation structure is used for fixing an optical fiber above a base plate. The optical fiber fixation structure has a protuberance that projects from an upper surface of the base plate and a resin that fixes both of the optical fiber and a covering material on the protuberance at a boundary between the covering material and an exposed portion of the optical fiber exposed from the covering material. The covering material covers a portion of an outer circumference of the optical fiber. The resin is formed so as to cover at least part of at least one of side surfaces of the protuberance.

Thus, a resin for fixing an optical fiber is formed so as to cover at least part of at least one of side surfaces of a protuberance that projects from an upper surface of a base plate. Therefore, even if a force such as a tensile stress is applied to the optical fiber, the resin is caught on the side surface of the protuberance. Accordingly, it is possible to obtain an optical fiber fixation structure with high reliability in which a resin is unlikely to come off. Furthermore, if the resin should come off, the positional misalignment of the optical fiber hardly occurs since the resin is caught on the side surface of the protuberance.

The at least one of the side surfaces of the protuberance may include a surface that is parallel to the optical axis of the optical fiber and/or a surface that is perpendicular to the optical axis of the optical fiber. Furthermore, the resin may be in contact with the upper surface of the base plate.

According to a second aspect of the present invention, there is provided a semiconductor laser module with high reliability that has a simple structure that can prevent a resin for fixing an optical fiber from coming off. The semiconductor laser module has a base plate, a semiconductor laser device disposed on the base plate, an optical fiber operable to transmit a laser beam emitted from the semiconductor laser device, a covering material that covers a portion of an outer circumference of the optical fiber, a protuberance that projects from an upper surface of the base plate, and a resin that fixes both of the optical fiber and the covering material on the protuberance at a boundary between the covering material and an exposed portion of the optical fiber exposed from the covering material. The resin is formed so as to cover at least one of side surfaces of the protuberance.

Thus, a resin for fixing an optical fiber is formed so as to cover at least part of at least one of side surfaces of a protuberance that projects from an upper surface of a base plate. Therefore, even if a force such as a tensile stress is applied to the optical fiber, the resin is caught on the side surface of the protuberance. Accordingly, it is possible to obtain a semiconductor laser module with high reliability in which a resin is unlikely to come off. Furthermore, if the resin should come off, the positional misalignment of the optical fiber hardly occurs since the resin is caught on the side surface of the protuberance.

The at least one of the side surfaces of the protuberance may include a surface that is parallel to the optical axis of the optical fiber and/or a surface that is perpendicular to the optical axis of the optical fiber. Furthermore, the resin may be in contact with the upper surface of the base plate.

The semiconductor laser module may further have a fiber holder that holds the optical fiber. In this case, it is preferable to cover an outer circumference of the optical fiber between the resin and the fiber holder with the covering material.

According to a third aspect of the present invention, there is provided a method of manufacturing a semiconductor laser module that can firmly fix an optical fiber by a resin and can prevent the resin from coming off. This method manufactures a semiconductor laser module having a semiconductor laser device operable to emit a laser beam and an optical fiber operable to transmit the laser beam emitted from the semiconductor laser device. In this method, the semiconductor laser device is disposed on a base plate, and the optical fiber is disposed above a protuberance that projects from an upper surface of the base plate. A first resin is applied within an upper surface of the protuberance, and a portion of the optical fiber disposed above the protuberance is located within the first resin. The optical fiber is positioned while a laser beam is emitted from the semiconductor laser device in a state in which the portion of the optical fiber is disposed within the first resin. The first resin is hardened to fix the optical fiber with respect to the protuberance in a state in which the optical fiber has been positioned. A second resin is applied so as to cover the first resin and the at least part of at least one of side surfaces of the protuberance so that a portion of the optical fiber that has been fixed with respect to the protuberance is located within the second resin. The second resin is hardened in a state in which the portion of the optical fiber is located within the second resin.

With this method, when an optical fiber is fixed to a protuberance, a first resin does not flow onto an upper surface of a base plate. Therefore, the first resin for fixing the optical fiber can be controlled with an appropriate amount. Thus, the optical fiber can firmly be fixed to the protuberance. Furthermore, even if a force such as a tensile stress is applied to the optical fiber, the second resin is caught on the side surface of the protuberance since at least part of the side surface of the protuberance is covered with the second resin. Accordingly, it is possible to prevent the resin from coming off. Moreover, if the resin should come off, the positional misalignment of the optical fiber hardly occurs since the resin is caught on the side surface of the protuberance.

Advantageous Effects of the Invention

According to the present invention, there can be provided an optical fiber fixation structure and a semiconductor laser module with high reliability that have a simple structure that can prevent a resin for fixing an optical fiber from coming off. Furthermore, according to the present invention, there can be provided a method of manufacturing a semiconductor laser module that can firmly fix an optical fiber by a resin and can prevent the resin from coming off.

MODE(S) FOR CARRYING OUT THE INVENTION

A semiconductor laser module according to embodiments of the present invention will be described below with reference to FIGS. 2 to 6. In FIGS. 2 to 6, like or corresponding parts are denoted by like or corresponding reference numerals and will not be described below repetitively.

Figure 2:
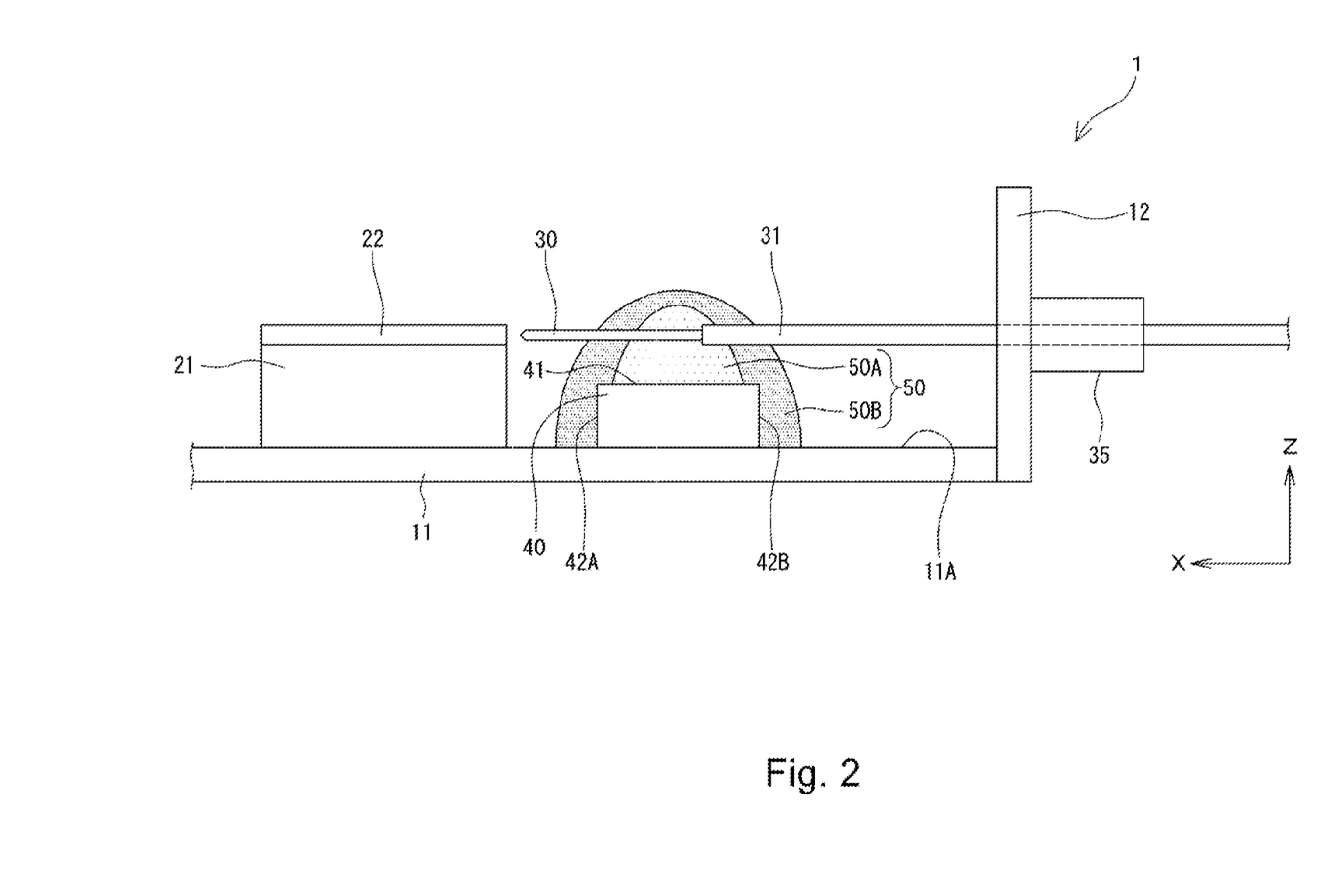
FIG. 2 is a front view schematically showing a semiconductor laser module according to an embodiment of the present invention.
Figure 3:
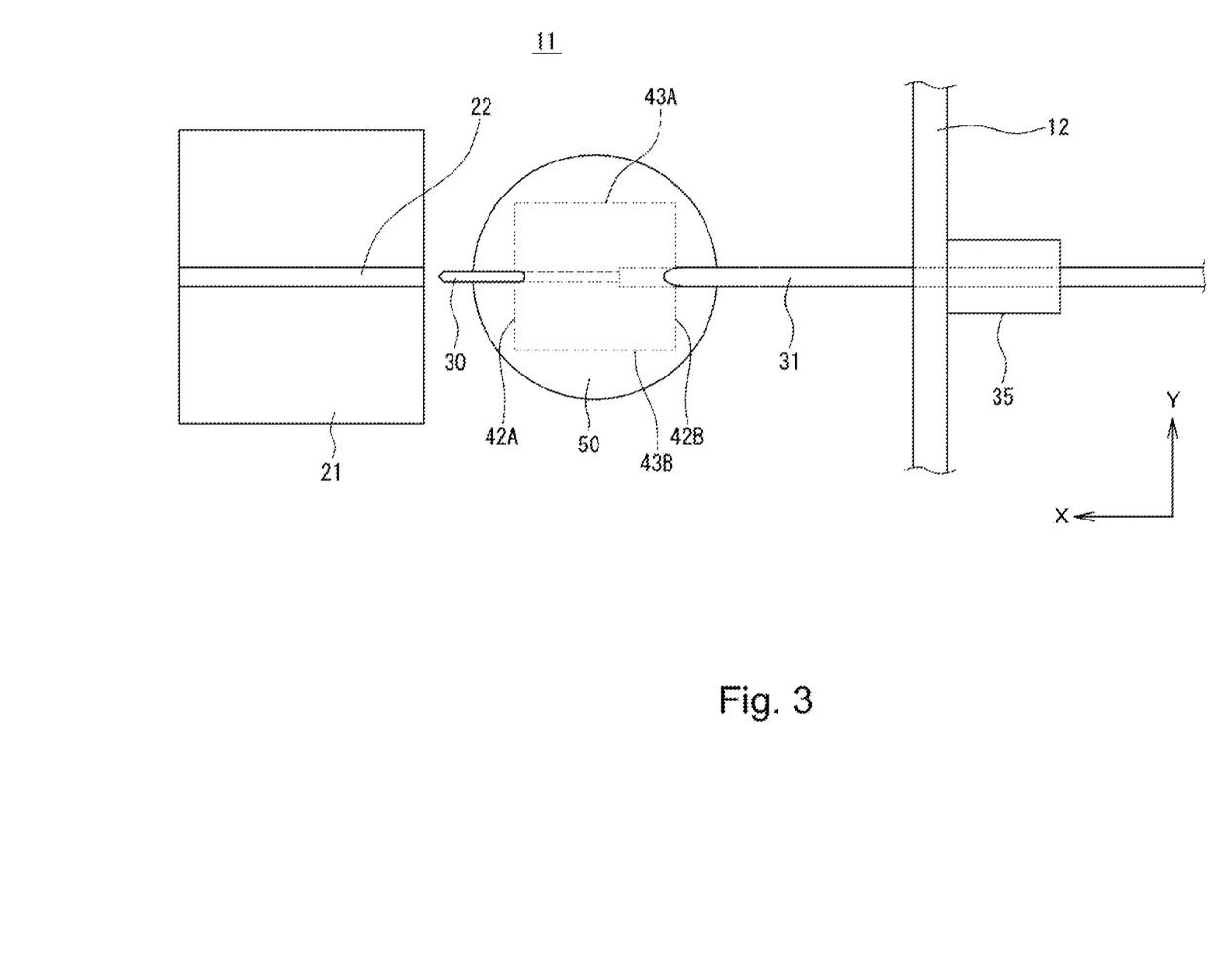
FIG. 3 is a plan view of the semiconductor laser module of FIG. 2.

FIG. 2 is a front view schematically showing a semiconductor laser module 1 according to an embodiment of the present invention, and FIG. 3 is a plan view thereof. As shown in FIGS. 2 and 3, the semiconductor laser module 1 of the present embodiment has a package housing including a base plate 11, sidewalls 12 surrounding the base plate 11 (only part of one sidewall is illustrated in FIGS. 2 and 3), and a cover member (not shown) covering an upper portion of the sidewalls 12. The base plate 11 is formed of a material such as W or Mo. A submount 21 is disposed on an upper surface 11A of the base plate 11. A high-power semiconductor laser device 22 is mounted on the submount 21. For example, a laser diode having a high power of several Watts to 20 W may be used as the semiconductor laser device 22.

The semiconductor laser module 1 has an optical fiber 30 operable to transmit a laser beam emitted from the semiconductor laser device 22 to an exterior of the package housing. An outer circumference of the optical fiber 30 is covered with a covering material 31 expect for an end of the optical fiber that is located near the semiconductor laser device 22. The covering material 31 is held within a fiber holder 35 fixed on the sidewall 12. The covering material 31 extends through a through hole formed in the sidewall 12. Thus, the covering material 31 is introduced into an interior of the package housing. In the present embodiment, a lensed fiber having a wedge-shaped end that faces the semiconductor laser device 22 is used as the optical fiber 30. However, the optical fiber 30 is not limited to such a lensed fiber.

As shown in FIGS. 2 and 3, a fiber mount 40 is disposed at a location spaced away from the submount 21 on the upper surface 11A of the base plate 11. For example, the fiber mount 40 is fixed to the upper surface 11A of the base plate 11 by solder. In the present embodiment, this fiber mount 40 forms a protuberance that projects from the upper surface 11A of the base plate 11.

As shown in FIG. 2, the optical fiber 30 and the covering material 31 are fixed above the fiber mount 40 with use of a resin 50. For example, a UV curing resin or a thermosetting resin may be used for the resin 50. When a UV curing resin is used for the resin 50, the optical fiber 30 can be fixed in a shorter period of time than in a case of using a thermosetting resin.

As shown in FIGS. 2 and 3, the resin 50, which is used to fix the optical fiber 30 and the covering material 31, is formed so as to cover the entire fiber mount 40. In other words, the resin 50 is formed so as to cover an upper surface 41 of the fiber mount 40, side surfaces 42A and 42B of the fiber mount 40 that are perpendicular to an optical axis of the optical fiber 30, and side surfaces 43A and 43B of the fiber mount 40 that are parallel to the optical axis of the optical fiber 30. In the illustrated embodiment, the resin 50 applied onto the fiber mount 40 is in contact with the upper surface 11A of the base plate 11.

The optical fiber 30 and the covering material 31 are fixed not only by the resin 50, but also by the fiber holder 35. Generally, the base plate 11 has a coefficient of linear expansion that is higher than that of quartz, which forms the optical fiber 30. Upon application of heat, therefore, the optical fiber 30 is tensioned in the X-direction between a portion of the optical fiber 30 that is fixed by the resin 50 and a portion of the optical fiber 30 that is fixed by the fiber holder 35. In the present embodiment, as described above, the resin 50 is formed so as to cover the side surfaces 42A and 42B of the fiber mount 40 (i.e., side surfaces 42A and 42B that is perpendicular to the optical axis of the optical fiber 30). Therefore, even if a tensile stress (a stress in the X-direction) is applied to the optical fiber 30 from an outside of the semiconductor laser module 1, the resin 50 is caught on the side surface 42A of the fiber mount 40. Accordingly, the resin 50 is unlikely to come off. Even if the resin 50 comes off, the position of the optical fiber 30 hardly changes in the X-direction. In this case, the resin 50 may not necessarily cover the entire side surfaces 42A and 42B of the fiber mount 40. Thus, the resin 50 may cover at least part of the side surfaces 42A and 42B of the fiber mount 40.

When the optical fiber 30 is fixed by the resin 50, a residual stress may be generated in the Y-direction due to the effects of shrinkage on curing of the resin 50. Thus, if the resin 50 comes off the fiber mount 40 because the resin 50 has been degraded in a severe environment or because the adhesive strength of the resin 50 has been lowered due to an insufficiently cleaned state of the fiber mount 40, then the optical axis of the optical fiber 30 may be deviated in the Y-direction due to the effects of the residual stress. Thus, the optical axis of the optical fiber 30 may become misaligned. In the present embodiment, the resin 50 is formed so as to cover the side surfaces 43A and 43B of the fiber mount 40 (i.e., the side surfaces 43A and 43B that are parallel to the optical axis of the optical fiber 30). Accordingly, if the resin 50 should come off to cause a residual stress to be applied to the optical fiber 30 in the Y-direction, the resin 50 is caught on the side surfaces 43A and 43B of the fiber mount 40. Therefore, the position of the optical fiber 30 hardly changes in the Y-direction. Because no stress is practically generated in the Z-direction except in special circumstances, this configuration can minimize the positional misalignment of the optical fiber 30. Accordingly, the optical fiber 30 can be held in a state in which the optical fiber 30 has been positioned with a high degree of precision. Thus, a failure of the semiconductor laser module 1 can be prevented effectively. The resin 50 may not necessarily cover the entire side surfaces 43A and 43B of the fiber mount 40. The resin 50 may cover at least part of the side surfaces 43A and 43B of the fiber mount 40.

Meanwhile, an exposed portion of the optical fiber 30 that is not covered with the covering material 31 is vulnerable to defects. If a stress such as a tensile stress is applied to such a defective portion of the optical fiber 30, the optical fiber 30 may be broken or destroyed. As described above, a tensile stress is likely to be generated in the optical fiber 30 between a portion of the optical fiber 30 that is fixed by the resin 50 and a portion of the optical fiber 30 that is fixed by the fiber holder 35. Therefore, in the present embodiment, an outer circumference of the optical fiber 30 is covered with the covering material 31 between the resin 50 and the fiber holder 35. In other words, the covering material 31 that covers the optical fiber 30 extends from the fiber holder 35 to the resin 50. Thus, with the covering material 31 extending from the fiber holder 35 to the resin 50, any defect can be prevented from being generated at a portion of the optical fiber 30 where a tensile stress is likely to be generated. Meanwhile, if only the covering material 31 is fixed by the resin 50, a tensile stress applied to the optical fiber 30 may remove adhesion between the optical fiber 30 and the covering material 31. In such a case, the optical fiber 30 is deviated from the covering material 31 to cause misalignment of the optical axis of the optical fiber 30. Therefore, in the present embodiment, both of the optical fiber 30 and the covering material 31 are fixed by the resin 50 as shown in FIG. 2.

Figure 4:
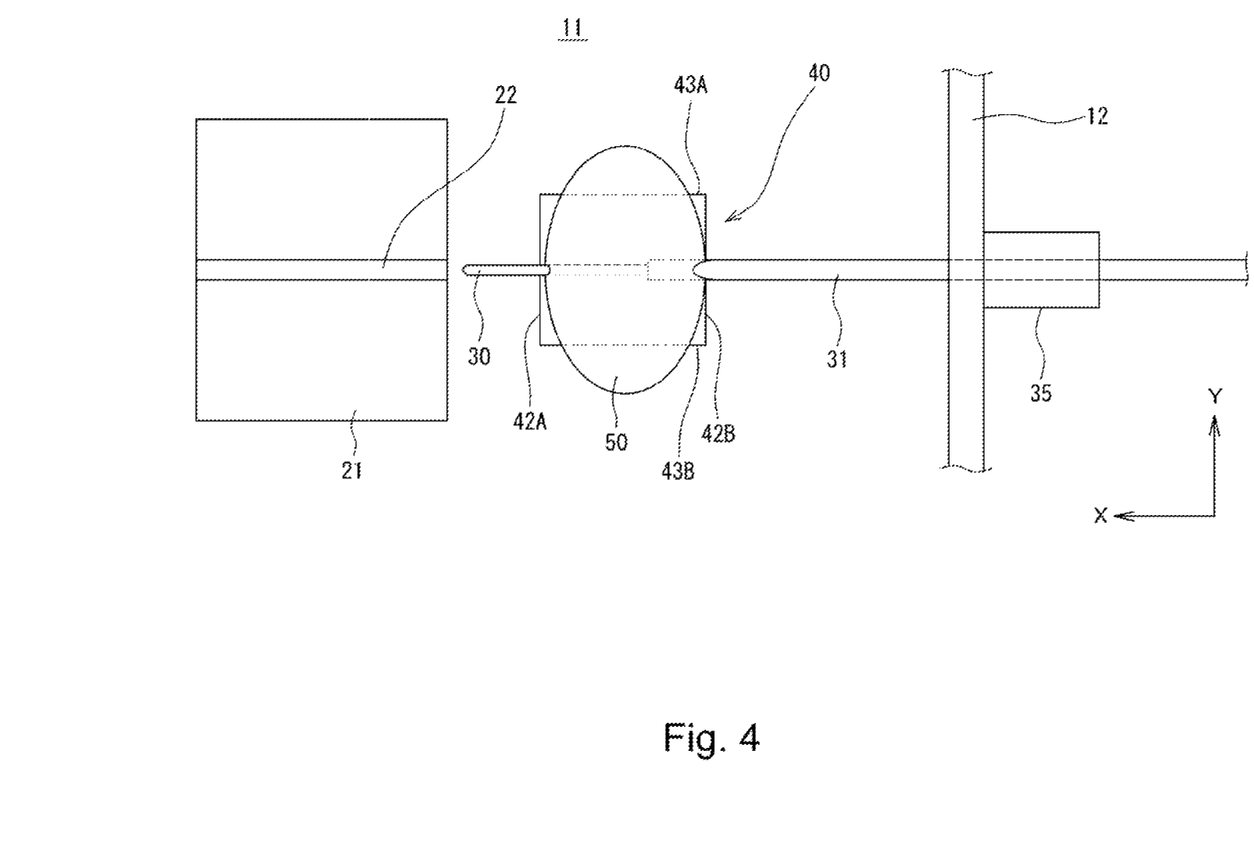
FIG. 4 is a plan view showing a semiconductor laser module according to another embodiment of the present invention.
Figure 5:
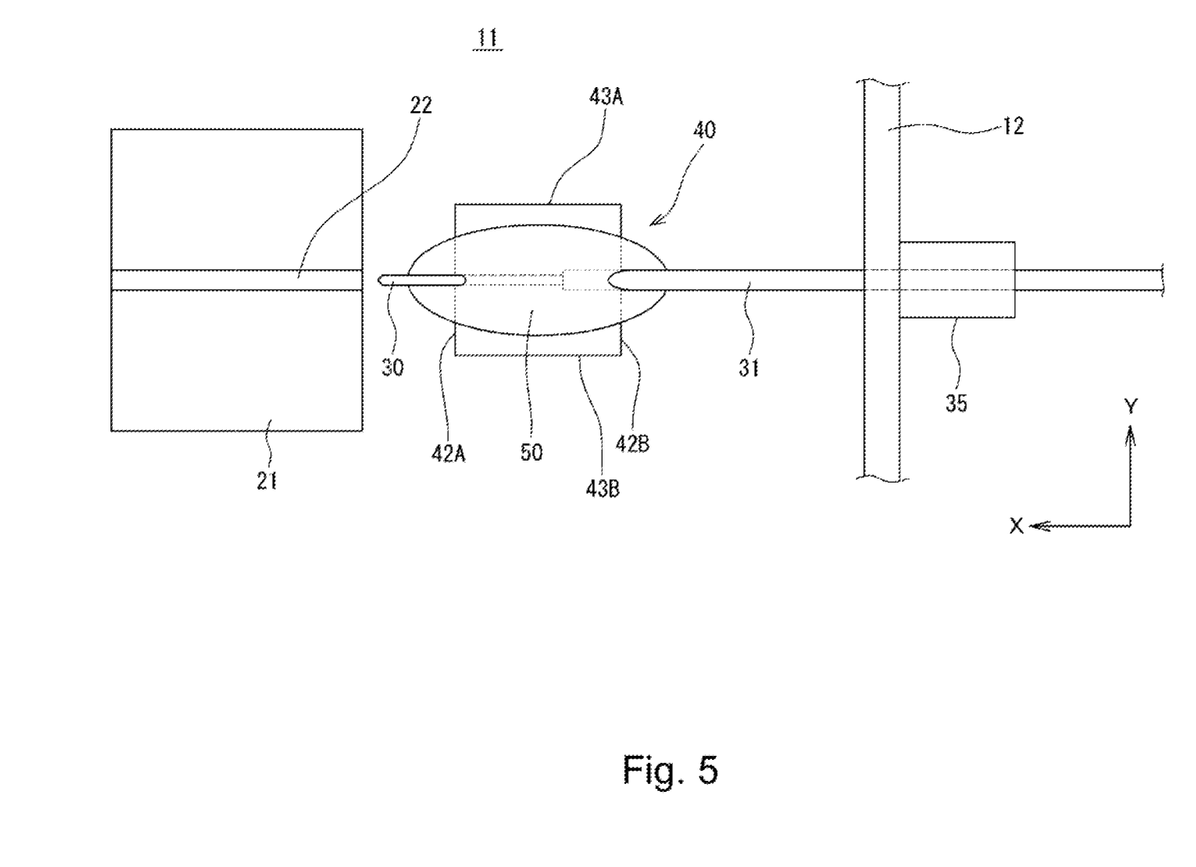
FIG. 5 is a plan view showing a semiconductor laser module according to still another embodiment of the present invention.

The present embodiment describes an example in which the resin 50 covers four side surfaces 42A, 42B, 43A, and 43B of the fiber mount 40. As shown in FIG. 4, however, the resin 50 may cover only part of both of the side surfaces 43A and 43B of the fiber mount 40 or may cover some or all of either one of the side surfaces 43A and 43B of the fiber mount 40. Furthermore, as shown in FIG. 5, the resin 50 may cover only part of both of the side surfaces 42A and 42B of the fiber mount 40 or may cover some or all of either one of the side surfaces 42A and 42B of the fiber mount 40. In the present embodiment, the resin 50 is in contact with the upper surface 11A of the base plate 11. The resin 50 should only be formed so as to cover at least part of the side surfaces 42A, 42B, 43A, and 43B of the fiber mount. Therefore, the resin 50 may not be in contact with the upper surface 11A of the base plate 11. Nevertheless, when the resin 50 is in contact with the upper surface 11A of the base plate 11, it is fixed not only onto the side surfaces of the fiber mount 40, but also onto the base plate 11. Accordingly, the resin 50 can be fixed more firmly as compared to a case where the resin 50 is out of contact with the upper surface 11A of the base plate 11.

The resin 50 does not cover an end surface of the optical fiber 30 near the semiconductor laser device 22 or an emission end surface of the semiconductor laser device 22. Thus, the end surface of the optical fiber 30 near the semiconductor laser device 22 and the emission end surface of the semiconductor laser device 22 are located outside of the resin 50. Particularly, if the emission end surface of the semiconductor laser device 22 is covered with the resin 50, the resin 50 attached to the emission end surface, which is subject to a high energy density when the power of the semiconductor laser device 22 increases, causes the end surface of the semiconductor laser device 22 to be damaged. Accordingly, in the present embodiment, the emission end surface of the semiconductor laser device 22 is located outside of the resin 50 so as to allow the semiconductor laser device 22 to have a high power.

For example, W, Mo, AlN, CuW, and the like may be used as a material for the fiber mount 40. Particularly, it is preferable to use a material having the lowest possible coefficient of linear expansion (for example, Mo) for the fiber mount 40, in order to reduce the amount of misalignment of the optical axis of the optical fiber 30 due to temperature change. Furthermore, it is also preferable to use a material having a low coefficient of linear expansion for the resin 50, in order to reduce the amount of misalignment of the optical axis of the optical fiber 30.

The reliability of the semiconductor laser module 1 can be improved by using a material having a coefficient of linear expansion that matches a coefficient of linear expansion of the submount 21 for the base plate 11. Furthermore, for a material of the base plate 11, it is preferable to use a material having a relatively high thermal conductivity among materials having a coefficient of linear expansion that matches a coefficient of linear expansion of the submount 21.

Figure 6:
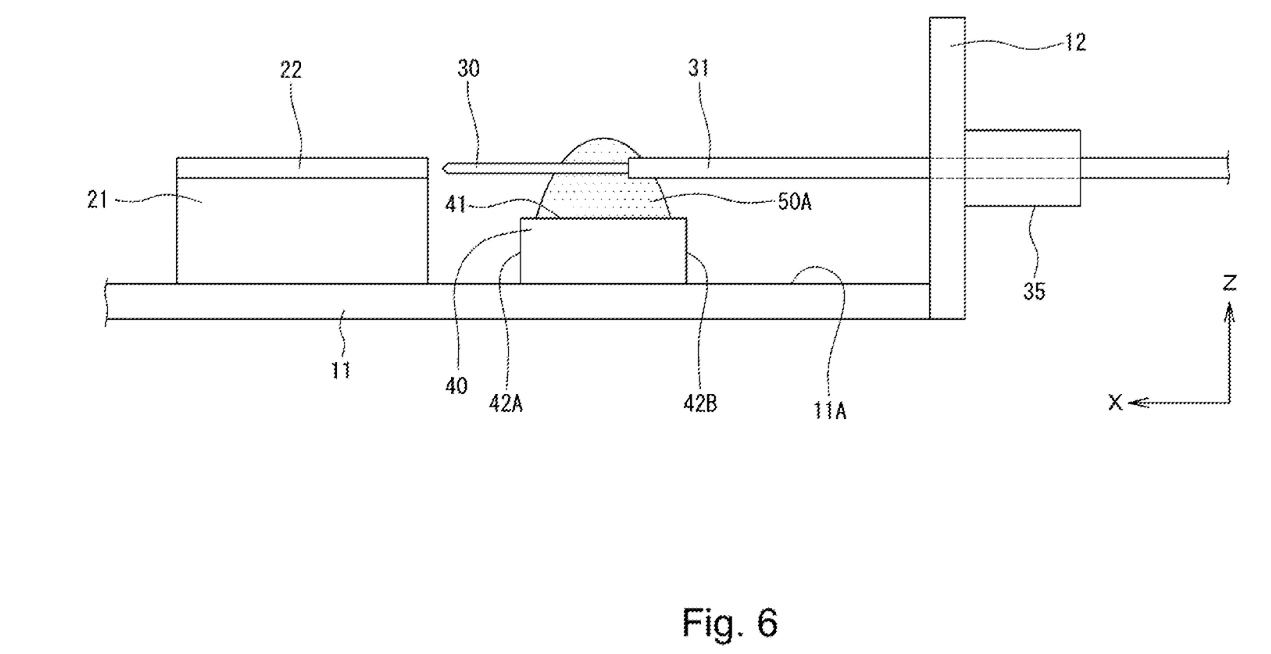
FIG. 6 is a schematic view showing a manufacturing process of a semiconductor laser module illustrated in FIG. 2.

Now a method of manufacturing the aforementioned semiconductor laser module 1 will be described. First, as shown in FIG. 6, a submount 21 on which a semiconductor laser device 22 has been mounted and a fiber mount 40 are fixed onto an upper surface 11A of the base plate 11 by solder. Then an optical fiber 30 is arranged above the fiber mount 40. A first resin 50A, e.g., a UV curing resin, is applied within a range of an upper surface 41 of the fiber mount 40, so that a portion of the optical fiber 30 and the covering material 31 is located within the first resin 50A.

In this state, the optical fiber 30 is moved and positioned while a laser beam is emitted from the semiconductor laser device 22 (active alignment). In the state in which the optical fiber 30 has been positioned with a high degree of precision, the first resin 50A is hardened by application of an ultraviolet ray to the first resin 50A or the like. Thus, the optical fiber 30 is fixed to the fiber mount 40.

Thereafter, as shown in FIG. 2, a second resin 50B is applied onto the first resin 50A so that a portion of the optical fiber 30 and the covering material 31 are located inside of the second resin 50B. At that time, the second resin 50B is applied so as to cover the first resin 50A and at least part of the side surfaces 42A, 42B, 43A, and 43B of the fiber mount 40. The second resin 50B may employ the same resin as the first resin 50A or a different resin than the first resin 50A. In this state, the second resin 50B is hardened by application of an ultraviolet ray to the second resin 50B or the like. In this manner, the semiconductor laser module 1 is completed.

In the present embodiment, the first resin 50A is applied within a range of the upper surface 41 of the fiber mount 40, and then the second resin 50B is applied so as to cover the first resin 50A and at least part of the side surfaces 42A, 42B, 43A, and 43B. However, if the first resin 50A is applied so as to cover the side surfaces 42A, 42B, 43A, and 43B of the fiber mount 40 without the aforementioned two-stage resin application process, then the first resin 50A flows onto the upper surface 11A of the base plate 11. Thus, it is difficult to control a proper amount of the first resin 50A applied to the upper surface 41 of the fiber mount 40. Therefore, in the present embodiment, resin is applied with two stages. Specifically, the first resin 50A firmly fixes the optical fiber 30 onto the fiber mount 40, and the second resin 50B covers at least part of the side surfaces 42A, 42B, 43A, and 43B of the fiber mount 40 to prevent the resin 50 from being peeled off.

In the aforementioned embodiment, the fiber mount 40, which is a separate member from the base plate 11, is fixed to the upper surface 11A of the base plate 11 so as to form a protuberance that projects from the upper surface 11A of the base plate 11. However, the base plate 11 may partially be thickened so as to form a protuberance that projects from the upper surface 11A of the base plate 11. In this case, the fiber mount 40 is not required as a separate member. Nevertheless, because a material that is difficult to be processed, such as W or Mo, is often used for the base plate 11, the semiconductor laser module 1 can be more readily manufactured by fixing the fiber mount 40 as a separate member on the upper surface 11A of the base plate 11, for example, by solder, than by partially thickening the base plate 11.

Example 1

A semiconductor laser module 1 was manufactured under the following conditions. A tensile stress was applied to an optical fiber 30. The characteristics of the semiconductor laser module 1 were examined. A flat plate formed of Mo that had a length of 2 mm along the X-direction, a length of 1 mm along the Y-direction, and a thickness of 0.3 mm along the Z-direction was used as a fiber mount 40. As shown in FIG. 2, the optical fiber 30 is fixed onto the fiber mount 40 in a state in which it projects from the side surface 42A of the fiber mount 40 toward the semiconductor laser device 22. With an increased distance between the laser emission end surface of the semiconductor laser device 22 and the fiber mount 40 along the X-direction, the optical fiber 30 becomes more likely to be broken due to vibration or impact. Accordingly, the distance between the laser emission end surface of the semiconductor laser device 22 and the fiber mount 40 along the X-direction was set to be the shortest possible value with which the resin 50 did not attach to the semiconductor laser device 22 or the submount 21. In this example, this distance was set to be 0.5 mm.

An epoxy-based UV curing resin (having a hardness of 90 D (durometer hardness) after hardening and a shear strength of 47 MPa) was used as the first resin 50A. As described above, the optical fiber 30 was positioned by adjusting the optical fiber 30 into an optimal position while the semiconductor laser device 22 is laser oscillated. Then an ultraviolet ray was applied to the first resin 50A to fix the optical fiber 30 onto the fiber mount 40. The same resin as the first resin 50A was used as the second resin 50B. The optical fiber 30 was fixed onto the fiber mount 40 by the first resin 50A and the second resin 50B. Thereafter, the optical fiber 30 (and the covering material 31) was bonded and fixed at the fiber holder 35.

In this manner, 11 samples were produced. A high tensile stress was applied to the optical fiber 30 of each of the samples, and a failure mode was examined. The resin 50 did not come off the fiber mount 40 in any sample. Only the optical fiber 30 came off the resin 50. This revealed that the optical fiber fixation structure of this example was a structure in which a resin was essentially unlikely to come off.

As described above, according to the present embodiment, a resin for fixing an optical fiber is formed so as to cover at least part of at least one of side surfaces of a protuberance that projects from an upper surface of a base plate. Therefore, even if a force such as a tensile stress is applied to the optical fiber, the resin is caught on the side surface of the protuberance. Accordingly, it is possible to obtain an optical fiber fixation structure with high reliability in which a resin is unlikely to come off. Furthermore, if the resin should come off, the positional misalignment of the optical fiber hardly occurs since the resin is caught on the side surface of the protuberance.

While the present invention has been described in detail with reference to the preferred embodiments thereof, it should be understood that the present invention is not limited to the aforementioned embodiments and may be made in various different forms within the technical concept of the present invention. In the above description, an optical fiber fixation structure according to the present invention is applied to a semiconductor laser module. However, an optical fiber fixation structure according to the present invention is applicable to any optical device, not limited to a semiconductor laser module. Furthermore, the term "above," "upper surface," "side surface," "base," and other positional terms used herein are shown with respect to the illustrated embodiments and may be varied depending on the relative positional relationship between components of the apparatus.

INDUSTRIAL APPLICABILITY

The present invention is suitably used for a structure for fixing an optical fiber in a semiconductor laser module.

DESCRIPTION OF REFERENCE NUMERALS AND SIGNS 1 semiconductor laser module
11 base plate
11A upper surface
12 sidewall
21 submount
22 semiconductor laser device
30 optical fiber
31 covering material
35 fiber holder
40 fiber mount
41 upper surface
42A, 42B, 43A, 43B side surface
50 resin
50A first resin
50B second resin

The invention claimed is:

1. A method of manufacturing a semiconductor laser module having a semiconductor laser device operable to emit a laser beam and an optical fiber operable to transmit the laser beam emitted from the semiconductor laser device, the method comprising:
disposing the semiconductor laser device on a base plate;
disposing the optical fiber above a protuberance that projects from an upper surface of the base plate;
applying a first resin within an upper surface of the protuberance and locating a portion of the optical fiber disposed above the protuberance within the first resin;
positioning the optical fiber while emitting a laser beam from the semiconductor laser device in a state in which the portion of the optical fiber is disposed within the first resin;
hardening the first resin to fix the optical fiber with respect to the protuberance in a state in which the optical fiber has been positioned;
applying a second resin so as to cover the first resin and at least part of the at least one of side surfaces of the protuberance so that a portion of the optical fiber that has been fixed with respect to the protuberance is located within the second resin and such that a longitudinal end of the optical fiber, facing the semiconductor device, projects out from the first resin and the second resin; and
hardening the second resin in a state in which the portion of the optical fiber is located within the second resin,
wherein the at least one of the side surfaces of the protuberance includes a surface that is perpendicular to the optical axis of the optical fiber and that faces the semiconductor laser device,
wherein the optical fiber includes a covered portion covered by a covering material and an exposed portion exposed from the covering material, the covering material covering a portion of an outer circumference of the optical fiber,
the second resin covers and contacts the covered portion and the exposed portion of the optical fiber, and
wherein the second resin covers and contacts the covered portion and the exposed portion of the optical fiber at a location just above the protuberance.

2. The method of manufacturing a semiconductor laser module as recited in claim 1, wherein the at least one of the side surfaces of the protuberance includes a surface that is parallel to the optical axis of the optical fiber.

3. The method of manufacturing a semiconductor laser module as recited in claim 2, further comprising bringing the second resin in contact with the base plate.

4. The method of manufacturing a semiconductor laser module as recited in claim 1, further comprising bringing the second resin in contact with the base plate.

5. The method of manufacturing a semiconductor laser module as recited in claim 1, wherein the at least one of the side surfaces of the protuberance includes a pair of two side surfaces located opposite to each other.

6. A semiconductor laser module comprising:
a base plate;
a semiconductor laser device disposed on the base plate;
an optical fiber operable to transmit a laser beam emitted from the semiconductor laser device;
a covering material that covers a portion of an outer circumference of the optical fiber;
a protuberance that projects from an upper surface of the base plate;
a first resin that fixes a portion of the optical fiber onto the protuberance;
a second resin that covers the first resin and at least part of the at least one of side surfaces of the protuberance so that the portion of the optical fiber fixed by the first resin is located within the second resin,
wherein a longitudinal end of the optical fiber, facing the semiconductor laser device, projects out from the first resin and the second resin, and
the at least one of the side surfaces of the protuberance includes a surface that is perpendicular to the optical axis of the optical fiber and that faces the semiconductor laser device,
wherein the optical fiber includes a covered portion covered by the covering material and an exposed portion exposed from the covering material, and
wherein the first resin covers and contacts the covered portion and the exposed portion of the optical fiber.

7. The semiconductor laser module as recited in claim 6, wherein the at least one of the side surfaces of the protuberance includes a surface that is parallel to the optical axis of the optical fiber.

8. The semiconductor laser module as recited in claim 6, wherein the second resin is in contact with the base plate.

9. A semiconductor laser module comprising:
a base plate;
a semiconductor laser device disposed on the base plate;
an optical fiber operable to transmit a laser beam emitted from the semiconductor laser device;
a covering material that covers a portion of an outer circumference of the optical fiber;
a protuberance that projects from an upper surface of the base plate;
a first resin that fixes a portion of the optical fiber onto the protuberance;
a second resin that covers the first resin and at least part of the at least one of side surfaces of the protuberance so that the portion of the optical fiber fixed by the first resin is located within the second resin,
wherein a longitudinal end of the optical fiber, facing the semiconductor laser device, projects out from the first resin and the second resin,
the optical fiber includes a covered portion covered by the covering material and an exposed portion exposed from the covering material,
the second resin covers and contacts the covered portion and the exposed portion of the optical fiber, and
wherein the second resin covers and contacts the covered portion and the exposed portion of the optical fiber at a location just above the protuberance.

10. The semiconductor laser module as recited in claim 9, wherein the at least one of the side surfaces of the protuberance includes a surface that is perpendicular to the optical axis of the optical fiber and that faces the semiconductor laser device.

11. The semiconductor laser module as recited in claim 9, wherein the at least one of the side surfaces of the protuberance includes a surface that is parallel to the optical axis of the optical fiber.

12. The semiconductor laser module as recited in claim 9, wherein the second resin is in contact with the base plate.

13. A semiconductor laser module comprising:
a base plate;
a semiconductor laser device disposed on the base plate;
an optical fiber operable to transmit a laser beam emitted from the semiconductor laser device;
a covering material that covers a portion of an outer circumference of the optical fiber;
a protuberance that projects from an upper surface of the base plate;
a first resin that fixes a portion of the optical fiber onto the protuberance;
a second resin that covers the first resin and at least part of the at least one of side surfaces of the protuberance so that the portion of the optical fiber fixed by the first resin is located within the second resin,
wherein a longitudinal end of the optical fiber, facing the semiconductor laser device, projects out from the first resin and the second resin,
the optical fiber includes a covered portion covered by the covering material and an exposed portion exposed from the covering material,
the second resin covers and contacts the covered portion and the exposed portion of the optical fiber, and
wherein the first resin covers and contacts the covered portion and the exposed portion of the optical fiber.

14. A method of manufacturing a semiconductor laser module having a semiconductor laser device operable to emit a laser beam and an optical fiber operable to transmit the laser beam emitted from the semiconductor laser device, the method comprising:
disposing the semiconductor laser device on a base plate;
disposing the optical fiber above a protuberance that projects from an upper surface of the base plate;
applying a first resin within an upper surface of the protuberance and locating a portion of the optical fiber disposed above the protuberance within the first resin;
positioning the optical fiber while emitting a laser beam from the semiconductor laser device in a state in which the portion of the optical fiber is disposed within the first resin;
hardening the first resin to fix the optical fiber with respect to the protuberance in a state in which the optical fiber has been positioned;
applying a second resin so as to cover the first resin and at least part of the at least one of side surfaces of the protuberance so that a portion of the optical fiber that has been fixed with respect to the protuberance is located within the second resin and such that a longitudinal end of the optical fiber, facing the semiconductor device, projects out from the first resin and the second resin; and
hardening the second resin in a state in which the portion of the optical fiber is located within the second resin,
wherein the at least one of the side surfaces of the protuberance includes a surface that is perpendicular to the optical axis of the optical fiber and that faces the semiconductor laser device,
wherein the optical fiber includes a covered portion covered by a covering material and an exposed portion exposed from the covering material, the covering material covering a portion of an outer circumference of the optical fiber,
the second resin covers and contacts the covered portion and the exposed portion of the optical fiber, and
wherein the first resin covers and contacts the covered portion and the exposed portion of the optical fiber.

* * * * *